(12) United States Patent
Chiang

(10) Patent No.: US 6,240,525 B1
(45) Date of Patent: May 29, 2001

(54) METHOD AND APPARATUS FOR RE-ADDRESSING DEFECTIVE MEMORY CELLS

(75) Inventor: Kevin Chiang, Fremont, CA (US)

(73) Assignee: Oak Technology, Inc., Sunnyvale, CA (US)

(*) Notice: Subject to any disclaimer, the term of this patent is extended or adjusted under 35 U.S.C. 154(b) by 0 days.

(21) Appl. No.: 09/193,593

(22) Filed: Nov. 17, 1998

(51) Int. Cl.⁷ ..................................... G06F 11/00
(52) U.S. Cl. ............................. 714/8; 365/201
(58) Field of Search ..................... 714/8, 5, 6, 7, 714/25, 29, 30, 42, 718, 719, 738, 742; 365/201

(56) References Cited

U.S. PATENT DOCUMENTS

| | | | |
|---|---|---|---|
| 4,667,330 | * 5/1987 | Kumagai | 371/71 |
| 5,410,687 | * 4/1995 | Fujisaki et al. | 395/575 |
| 5,473,573 | * 12/1995 | Rao | 365/230.01 |
| 5,708,601 | * 1/1998 | McKenny et al. | 365/185.09 |
| 5,793,385 | * 8/1998 | Nale | 345/515 |
| 5,801,986 | * 9/1998 | Matsumoto et al. | 365/185.09 |
| 5,831,915 | * 11/1998 | Pascucci | 365/200 |

OTHER PUBLICATIONS

Matsumoto et al., Semiconductor memory device dnd method of manufacturing the same, EPAB, Pub. No. EP000758785A2, 1–1.*

Osawa, Semiconductor memory testing device, JPAB, Pub. No. JP405126919A, 1–1.*

* cited by examiner

Primary Examiner—Nadeem Iqbal
(74) Attorney, Agent, or Firm—William L. Paradice, III

(57) ABSTRACT

A semiconductor memory is partitioned into a predetermined number of sections. A first register stores dynamic values indicative of whether corresponding cells of the memory are defective, and includes an input terminal coupled to receive addresses from an associated address generator. A second register stores address mappings of corresponding pages in each of the partitioned sections, and includes an input terminal coupled to receive addresses from the address generator. A multiplexer includes first and second input terminals coupled to receive addresses from the address generator and mapped addresses from the second register, respectively, a control terminal coupled to receive the dynamic values from the first register, and an output terminal coupled to the address input lines of the memory. When the address generator generates a memory address in response to a request for instructions or data from an associated CPU, the first register checks whether the addressed memory location is defective. If the corresponding memory cell is not defective, information is read from or written to the corresponding memory cell. If, on the other hand, the corresponding memory cell is defective, the information is re-addressed to a corresponding cell of another partition of the memory array.

19 Claims, 2 Drawing Sheets

| TAG | ADDRESS |
|---------|---------|
| 0 0 0 0 | 1 1 0 0 |
| 0 0 0 1 | 1 1 0 1 |
| 0 0 1 0 | 1 1 1 0 |
| 0 0 1 1 | 1 1 1 1 |

FIG. 2

METHOD AND APPARATUS FOR RE-ADDRESSING DEFECTIVE MEMORY CELLS

BACKGROUND

1. Field of Invention

This invention relates generally to semiconductor memories and specifically to semiconductor memories having one or more defective cells.

2. Description of Related Art

Modern semiconductor memory devices such as, for instance, SRAM, DRAM, EEPROM, and Flash Memory, store millions of bits of information on a single chip. These memory devices require at least one transistor per memory cell, in addition to the thousands of transistors required for peripheral logic functions, e.g., row and column decoders, sense amps, and so on. Thus, even when manufactured using state of the art wafer fabrication technology, a one Megabyte semiconductor memory device may include hundreds or even thousands of defective cells. Additional memory cells may become defective during operation of such semiconductor memories. Although numerous well known redundancy techniques are available to repair defective memory cells, implementation of such techniques consumes considerable silicon area and is therefore typically impractical where die size is of primary concern.

The extent to which defective memory cells affect computer performance depends in part upon the particular application for which the semiconductor memory is used. For instance, since video data is relatively static, i.e., adjacent pixel information is often identical, the presence of one or two defective cells in a common row i.e., page, of memory has a minimal effect upon the resultant video image. However, where all bit information is vital, e.g., when storing encryption key information, the presence of even one defective cell can significantly degrade performance.

Application-Specific Integrated Circuits (ASIC) are well known and typically include an on-chip semiconductor memory. ASICs are used in a wide variety of applications ranging from cellular phones to dishwashers to DVD players and typically perform vital functions for their hosts, e.g., a DVD player. When some of the memory cells of an ASIC become defective during operation, the corresponding page of the memory becomes unusable. In some applications, a defective page may render the entire memory defective and, therefore, render the ASIC useless. Since, as described above, cell redundancy circuitry is often not feasible, there is a need to compensate for defective memory cells while sustaining normal ASIC operation, and without consuming additional silicon area.

SUMMARY

A method and apparatus are disclosed which prevent defective memory cells from corrupting an entire memory array. In accordance with the present invention, a semiconductor memory array is partitioned into a predetermined number of sections. A first register stores dynamic values indicative of whether corresponding cells of the memory are defective, and includes an input terminal coupled to receive addresses from an associated address generator. A second register stores address mappings of corresponding cells in each of the partitioned sections, and includes an input terminal coupled to receive addresses from the address generator. A multiplexer includes first and second input terminals coupled to receive addresses from the address generator and mapped address from the second register, respectively, a control terminal coupled to receive the dynamic values from the first register, and an output terminal coupled to the address input lines of the memory array. When the address generator provides an address in response to a request from an associated CPU, the first register indicates whether the memory location addressed by the request is defective. If the corresponding memory cell is not defective, information is read from or written to the corresponding memory cell as normal. If, on the other hand, the corresponding memory cell is defective, the information is re-addressed to a corresponding cell of another partitioned section of the memory according to the address mapping provided by the second register. In some embodiments, a page of memory associated with the defective cell is re-addressed to a corresponding page in another partitioned section.

BRIEF DESCRIPTION OF THE DRAWINGS

FIG. 2 is a block diagram illustrating a register in one embodiment of the present invention.

Like reference numerals refer to corresponding parts throughout the drawing figures.

DETAILED DESCRIPTION

Figure 1:
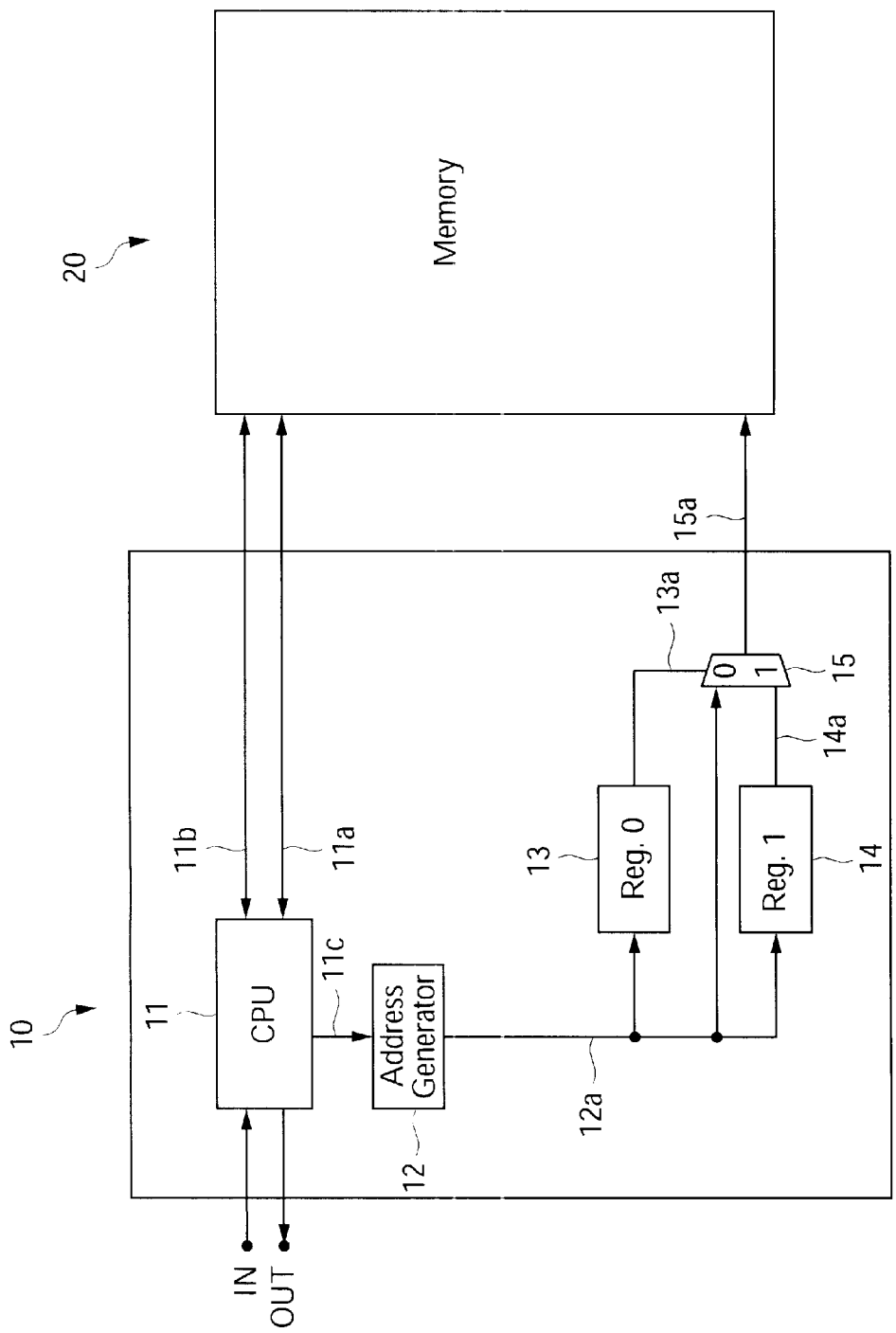
FIG. 1 is a block diagram of an ASIC and an associated semiconductor memory configured in accordance with the present invention.

Embodiments of the present invention are discussed below in the context of an ASIC for simplicity only. It is to be understood that embodiments of the present invention are equally applicable to a wide variety of structures which utilize semiconductor memory. Accordingly, the present invention is not to be construed as limited to specific examples described herein but rather includes within its scope all embodiments defined by the appended claims.

FIG. 1 shows an ASIC 10 and associated memory array 20 configured in accordance with the present invention. The ASIC 10 includes a CPU 11 for processing data and associated control signals received from an input port IN and, in response thereto, provides output data and associated control signals to an output port OUT. The input port IN and output port OUT are coupled to other circuitry (not shown) operating in association with the ASIC 10. The CPU 11, which is of a suitable well known design, is coupled to provide control signals to the memory 20 via control line 11a and is coupled to exchange data with the memory 20 via bidirectional signal line 11b. An address generator 12 generates addresses of instructions and associated data stored in the memory 20 and requested by the CPU 11 via signal line 11c, and has an output terminal coupled to a signal line 12a for providing such addresses to input ports of a first register 13 and a second register 14, as well as to the "0" input terminal of the multiplexer 15. The first register 13 has an output terminal coupled to the control terminal of the multiplexer 15 via a signal line 13a, and the second register 14 has an output port coupled to the "1" input port of the multiplexer 15 via a signal line 14a. The multiplexer 15 includes an output port coupled to the input address lines of the memory 20 via signal line 15a. Where the addresses provided by the address generator 12 are, for instance, 9-bits, the multiplexer 15 is a 2-input, 9-bit multiplexing structure, and the signal lines discussed above are 9-bit bus structures. Of course, present embodiments are easily adapted to operate with addresses of greater or fewer bits, as will be apparent to one of skill in the art after reading this disclosure.

The memory 20, which may be any suitable memory capable of storing binary information such as, for instance, DRAM, Flash, EEPROM, SRAM, SDRAM, etc., is preferably partitioned into a predetermined number of sections of equal size, although in other embodiments the partitioned sections of the memory 20 may be of varying size, as may be required by particular applications. A first portion of the partitioned sections of the memory 20 is initially designated for use by the ASIC 10 during normal operation. A second portion of the partitioned sections is designated as replacement memory for use by the ASIC if memory cells within the first portion of partitioned sections are or later become defective. Note that although shown in FIG. 1 as being external to the ASIC 10, in some embodiments the memory 20 may be incorporated within the ASIC 10, e.g., on-chip.

The first register 13 stores information indicative of whether any of the memory cells in the memory 20 are defective. The existence and location of defective cells within the memory 20 are determined during initial power up of the ASIC 20 according to well known techniques. This defective cell information is then stored within the first register 13, where a logic "0" indicates that a corresponding page in memory 20 does not contain any defective cells and, conversely, a logic "1" indicates that the corresponding page in memory 20 contains one or more defective memory cells. In preferred embodiments, each memory location in the first register 13, which may be any suitable look-up table, register, or similar structure, stores a value indicative of whether a corresponding page in the memory 20 includes one or more defective cells.

The second register 14 stores address mapping between the first and second portions of partitioned sections of the memory 20. In some embodiments, an address of a page within the first portion of partitioned memory sections, as provided to the second register 14 by the address generator 12, is used as a tag to locate in the second register 14 the address of a designated corresponding page within the second portion of partitioned memory sections. For instance, a portion of the second register 14 is shown in FIG. 2 as having four entries. Here, an address provided by the address generator 12 is compared to the tag entries in the second register 14 which, in turn, provides a corresponding address to the multiplexer 15. The mapping information may be stored in the second register 14 according to well known techniques. In some embodiments, the mapping information is user selectable. In other embodiments, the mapping information is dynamic whereby upon detection of a defective memory cell, the page within which the defective cell sits is mapped to the last available address in the second portion of partitioned memory sections.

The address mapping provided by the second register 14 to the "1" input terminal of the multiplexer 15 points to a memory location in the second portion of the partitioned sections of the memory 20. Thus, depending upon the value of the binary signal provided by the first register 13 to the control terminal of the multiplexer 15, the multiplexer 15 forwards to the address lines of the memory 20 either the address from the address generator 12 or the mapped address from the second register 14. In this manner, the multiplexer 15 effects replacement of a defective cell in the first portion of partitioned memory sections with a corresponding cell in the second portion of partitioned memory sections. Data is then written to, or read from, depending upon the request from the CPU 11, a mapped memory location in the second portion of the partitioned memory 20 via line 11a.

The number of sections into which the memory 20 is partitioned, as well as the size of each partitioned section, may vary depending upon specific application requirements. Further, the mapping information stored in the second register 14 varies depending upon the partitioning configuration of the memory 20. In one embodiment, for example, where the memory 20 includes a 1M×16 DRAM array having 1 k pages of 1 k memory cells, the ASIC uses during normal operation 800 pages of the memory 20. Here, the memory is partitioned into two sections, the first section containing the first 800 page addresses and the second section containing the last 200 page addresses. Note that since in this example there are only two partitions, the first and second memory portions discussed above correspond with the first and second partitions, respectively.

During normal operation, the CPU 11 of the ASIC 10 sends a request to the address generator 12 which, in turn, forwards an address identifying the information (e.g., data or instructions) requested by the CPU 11 to the first register 13, the second register 14, and the multiplexer 15. This address is matched with a corresponding entry in the first register 13 which, as discussed above, provides to the control terminal of the multiplexer 15 a binary signal indicative of the condition of the addressed memory locations within the first 800 pages of the memory 20, i.e., within first partitioned memory section. This address is also matched with a corresponding entry in the second register 14 which, as discussed above, forwards to the multiplexer 15 a corresponding memory address within the last 200 pages of the memory 20, i.e., the second partitioned memory section.

Thus, if the cell identified by the address provided by the address generator 12 is not defective, the first register 13 forwards a binary "0" to the control terminal of the multiplexer 15 which, in turn, forwards the address provided by the address generator 12 to the memory 20. Here, normal operation continues. If, on the other hand, the addressed cell is defective, the first register 13 forwards a binary "1" to the control terminal of the multiplexer 15 which, in turn, forwards the mapped address provided by the second register 14 to the memory 20. Here, the memory page containing the defective memory cell is mapped to an available page in the second partitioned memory section. Hereafter, all information corresponding to the defective cell's page is stored in the mapped "replacement" page of the second partitioned memory section. In this manner, the present invention isolates defective memory locations by mapping such locations to available memory in the second partition. Further, since defective memory cells are mapped to available and previously unused memory locations, present embodiments advantageously use existing memory to replace defective memory and, accordingly, do not require additional "replacement" memory.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A structure for re-addressing memory locations between first and second partitioned sections of a memory, comprising:

an address generator for generating an address corresponding to a memory cell within said first partitioned section of said memory in response to a request made by an associated CPU;

a first register having an input port coupled to receive said address and having an output port, said first register storing information indicative of whether said memory cell is defective;

a second register having an input port coupled to receive said address and having an output port, said second register storing cell address mappings between corresponding first and second partitioned sections of said memory; and a multiplexer having a first input terminal coupled to receive said address, a second input terminal coupled to said output terminal of said second register, a control terminal coupled to said output terminal of said first register, and an output terminal coupled to an address input line of said memory, said multiplexer forwarding either said address or one of said address mappings to said memory in response to said information indicative of whether said memory cell is defective.

2. The structure of claim 1, wherein said memory comprises a non-volatile memory.

3. The structure of claim 1, wherein said first register stores dynamic values indicative of whether said memory cell is defective.

4. The structure of claim 3, wherein said second register stores alternate addresses for said defective memory cell.

5. The structure of claim 1, wherein said first and second registers comprises look-up tables.

6. The structure of claim 1, wherein said address mapping information is user-selectable.

7. The structure of claim 1, wherein said address mapping information is dynamic and increments from a last available memory location in said second partitioned section of said memory.

8. An application-specific integrated circuit capable of re-addressing memory locations between first and second partitioned sections of a memory, comprising:

an address generator for generating an address in response to a request made by an associated CPU, said address corresponding to a memory cell within said first partitioned section of said memory;

a first register having an input port coupled to receive said address and having an output port, said first register storing information indicative of whether said memory cell is defective;

a second register having an input port coupled to receive said address and having an output port, said second register storing cell address mappings between corresponding first and second partitioned sections of said memory; and a multiplexer having a first input terminal coupled to receive said address, a second input terminal coupled to said output terminal of said second register, a control terminal coupled to said output terminal of said first register, and an output terminal coupled to an address input line of said memory, said multiplexer forwarding either said address or one of said address mappings to said memory in response to said information indicative of whether said memory cell is defective.

9. The structure of claim 8, wherein said application-specific integrated circuit comprises said CPU.

10. The structure of claim 8, wherein said first register stores dynamic values indicative of whether said memory cell is defective.

11. The structure of claim 8, wherein said information indicative of whether said memory cell is defective is provided to said first register during power-up of said application-specific integrated circuit.

12. A method for re-addressing one or more cells of a memory, comprising:

partitioning said memory into first and second sections;

generating an address identifying a memory location in said first partitioned section of said memory;

determining whether said memory location is defective; and providing to said memory, in response to said determining step, either said address or a mapped address identifying a memory location in said second partitioned section of said memory, to facilitate storing said data in said memory.

13. The method of claim 12, wherein said address is generated in response to a request made by a CPU.

14. The method of claim 13, wherein said memory is on-chip within a host application-specific integrated circuit.

15. The method of claim 14, wherein said application-specific integrated circuit comprises said CPU.

16. The method of claim 12, wherein information indicative of whether said memory location in said first partitioned section is defective is stored in a first register and said mapped address is stored in a second register.

17. The method of claim 12, wherein said providing step is implemented using a multiplexer having first and second input terminals coupled to receive said address and said mapped address, respectively, a control terminal coupled to receive said information from said first register, and an output terminal coupled to an address input line of said memory.

18. The method of claim 12, wherein said determining step is performed during power-up of said memory.

19. The method of claim 12, wherein said first and second partitioned sections of said memory are user-selectable.

* * * * *